(12) United States Patent
Zeller

(10) Patent No.: US 11,255,940 B2
(45) Date of Patent: Feb. 22, 2022

(54) METHOD AND SYSTEM FOR CREATING MAGNETIC RESONANCE IMAGES

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/574,125

(22) Filed: Sep. 18, 2019

(65) Prior Publication Data
US 2020/0088826 A1 Mar. 19, 2020

(30) Foreign Application Priority Data

Sep. 18, 2018 (EP) .................................... 18195188

(51) Int. Cl.
*G01R 33/561* (2006.01)
*G01R 33/483* (2006.01)
*G01R 33/565* (2006.01)

(52) U.S. Cl.
CPC ...... *G01R 33/5611* (2013.01); *G01R 33/4835* (2013.01); *G01R 33/5616* (2013.01); *G01R 33/5618* (2013.01); *G01R 33/56509* (2013.01); *G01R 33/56545* (2013.01)

(58) Field of Classification Search
CPC ............ G01R 33/5611; G01R 33/4835; G01R 33/5616; G01R 33/5618; G01R 33/56509; G01R 33/56545; G01R 33/5617; G01R 33/56341; G01R 33/56; A61B 5/055
See application file for complete search history.

(56) References Cited

U.S. PATENT DOCUMENTS

| 6,043,651 A | 3/2000 | Heid |
| 10,018,697 B2 | 7/2018 | Ding et al. |
| 2012/0249138 A1 | 10/2012 | Pfeuffer |

(Continued)

FOREIGN PATENT DOCUMENTS

| CN | 107209238 A | 9/2017 |
| CN | 108010094 A | 5/2018 |

OTHER PUBLICATIONS

Peterson E. et al.: "Slice-wise Nyquist Ghost Correction for Slice-Accelerated—EP". Proceedings of the International Society for Magnetic Resonance in Medicine, Joint Annual Meeting ISMRM-ESMRMB, Nr. 1637, Apr. 28, 2014 (Apr. 28, 2014); p. 1637; XP040662706, Milan, Italy.

(Continued)

*Primary Examiner* — Rishi R Patel
(74) *Attorney, Agent, or Firm* — Schiff Hardin LLP

(57) ABSTRACT

In a method and system, a reference dataset is recorded using a reference scan based on a GRE or RA RT sequence. A correction dataset is also recorded using a phase correction scan based on a non-phase-encoding EPI sequence. A measurement dataset is recorded using an SMS sequence. Slice-specific GRAPPA kernels are determined from the reference dataset and magnetic resonance images are created by a slice GRAPPA method. Data of the measurement dataset belonging to different slices is separated from one another using the slice-specific GRAPPA kernels and N/2 ghost artifacts are corrected using the correction dataset.

14 Claims, 5 Drawing Sheets

(56) References Cited

U.S. PATENT DOCUMENTS

| | | | |
|---|---|---|---|
| 2015/0309142 A1* | 10/2015 | Li | G01R 33/5611 |
| | | | 324/309 |
| 2017/0038450 A1 | 2/2017 | Hoge et al. | |
| 2017/0089999 A1 | 3/2017 | Zeller et al. | |
| 2017/0307717 A1 | 10/2017 | Geraghty et al. | |
| 2018/0017653 A1 | 1/2018 | Chen et al. | |
| 2018/0074147 A1 | 3/2018 | Carinci et al. | |
| 2019/0122398 A1 | 4/2019 | Huang | |

OTHER PUBLICATIONS

Baron, Corey A. et. al.; "Motion Robust GRAPPA for Echo-Planar Imaging"; in Magnetic Resonance in Medicine; vol. 75; pp. 1166-1174, 2016.

Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011).

Yarach U. et al.: "Correction of Slice-Specific Nyquist Artifact for Simultaneous Multi-Slice EPI", Proceedings of the International Society for Magnetic Resonance in Medicine, Joint Annual Meeting ISMRM-ESMRMB, Nr. 4120, Jun. 1, 2018 (Jun. 1, 2018); XP040703328; Paris, France.

Koopmans P. J. et al.: "2D-SENSE-GRAPPA For Fast, Ghosting-Robust Reconstruction of In-Plane and Slice Accelerated Blipped-CAIPI-EPI", Proceedings of the International Society for Magnetic Resonance in Medicine, 23rd Annual Meeting & Exhibition, Nr. 2410, May 15, 2015 (May 15, 2015), p. 2410; XP040668087; Toronto, Canada.

Lyu M. et al.:"Robust 2D Nyquist Ghost Correction for Simultaneous Multislice (SMS) EPI Using Phase Error Correction SENSE and Virtual Coil SAKE", Proceedings of the International Society for Magnetic Resonance in Medicine, 25th Annual Meeting & Exhibition, Nr. 515, Apr. 7, 2017 (Apr. 7, 2017), XP04068808.

European Search Report dated Mar. 15, 2019, for Application No. 18195188.0.

Chinese Action dated Jun. 29, 2021, Application No. 201910881311.6 (with translation).

K. Setsompop et al., "Improving diffusion MRI using simultaneous multi-slice echo planar imaging" Elsevier, NeuroImage 63 (2012) 569-580.

* cited by examiner

METHOD AND SYSTEM FOR CREATING MAGNETIC RESONANCE IMAGES

CROSS REFERENCE TO RELATED APPLICATIONS

This patent application claims priority to European Patent Application No. 18195188.0, filed Sep. 18, 2018, which is incorporated herein by reference in its entirety.

BACKGROUND

Field

The disclosure relates to a method for creating magnetic resonance images of a target object and to a magnetic resonance system configured for this purpose. Further aspects of the present disclosure are a corresponding computer program or computer program product, a corresponding data medium signal and a computer-readable data medium on which an inventive computer program or computer program product is stored.

Related Art

These days magnetic resonance imaging is an established and well-known specialist field in which numerous different methods for data acquisition and imaging are known. One such method is Parallel Imaging (PI). A known technique of parallel imaging is Generalized Autocalibrating Partial Parallel Acquisition (GRAPPA). In this method only a reduced amount of data is recorded and the non-recorded data is reconstructed with the aid of information about the distribution of a number of coils or coil channels arranged around a respective examination object. In another method data can be acquired simultaneously from a number of slices of an examination object or target object to be imaged, which is also referred to as Simultaneous Multislice (SMS) imaging. In such methods the data of the individual slices excited and imaged simultaneously is not present separately from one another, but collapsed, i.e. superimposed on one another. For separating or uncollapsing this superimposed slice data, what is known as the slice GRAPPA technique, a variant of the GRAPPA method, is used. With the GRAPPA technique, so-called GRAPPA kernels are used for reconstruction of the missing data, for which a corresponding calibration is needed. For the slice or slice GRAPPA technique slice-specific GRAPPA kernels are used to obtain the individual slices, for which likewise a corresponding calibration is necessary.

To obtain the GRAPPA kernels or for the calibration and also for the correction of faults or artifacts occurring in the data acquisition and/or a creation or reconstruction of magnetic resonance images from the acquired data, one or more preliminary scans, also referred to as a reference scan or correction scan, can be carried out. This preliminary scan is carried out in particular before an imaging scan for acquisition of the actual magnetic resonance data for the magnetic resonance images of the target object.

Since in SMS methods the individual slice data is collapsed, correction methods known from non-simultaneous imaging methods cannot readily be used.

Therefore relatively time-consuming preparation and reference scans have previously been used for the calibration or artifact correction respectively, which disadvantageously can take up a significant proportion of the overall time needed for examination of the target object.

The publication "Motion Robust GRAPPA for Echo-Planar Imaging" by Corey A. Baron and Christian Beaulieu in Magnetic Resonance in Medicine 75:1166-1174 (2016) describes a method for acquiring robust GRAPPA calibration data for EPI-based imaging (EPI: Echo-Planar Imaging).

US 2018/0 074 147 A1 describes a method for implementing a TSE-based reference scan (TSE: Turbo Spin Echo) for SMS acquisition of magnetic resonance data.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
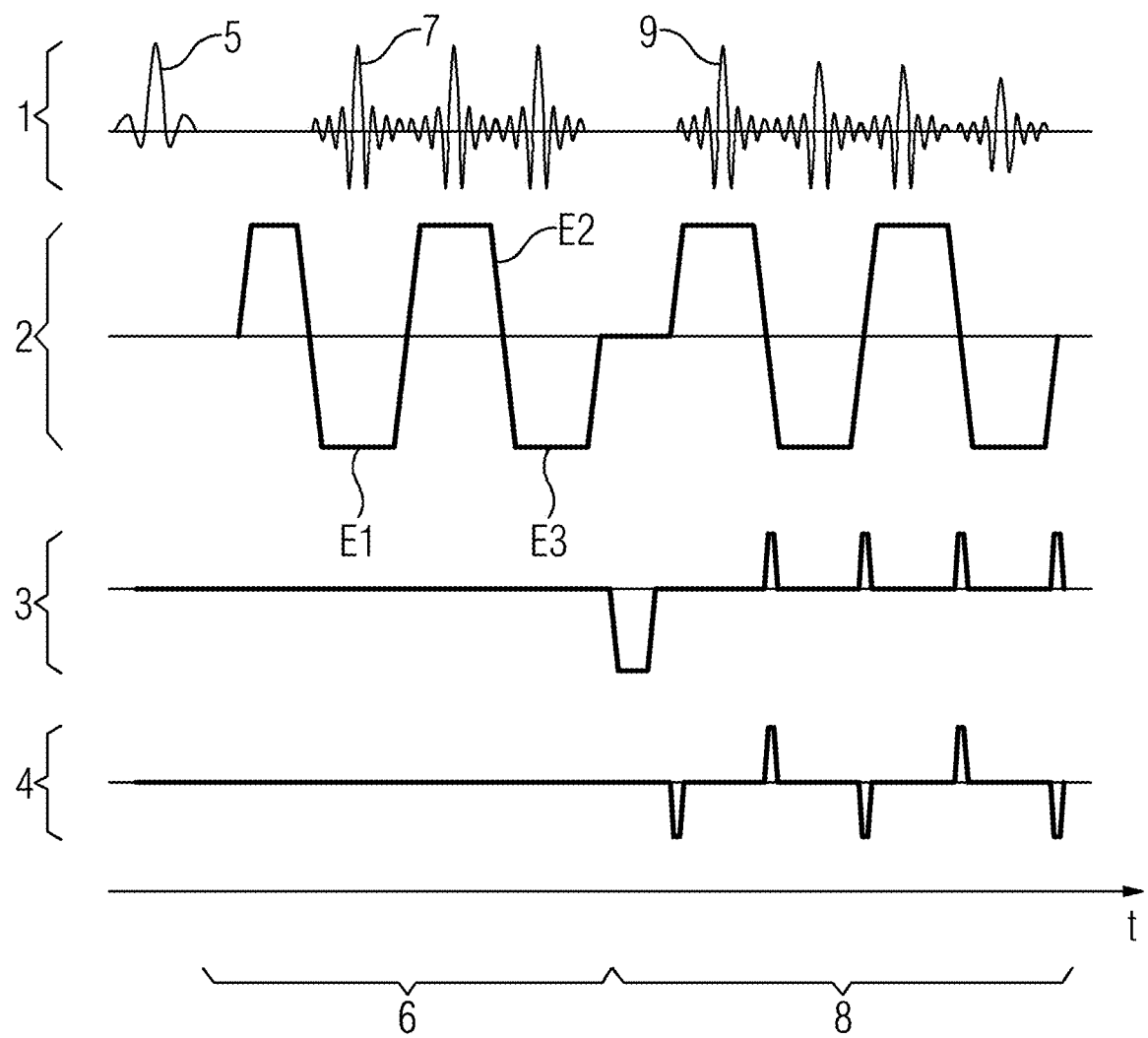
FIG. 1 is a schematic illustration of a conventional non-simultaneous multislice data acquisition in magnetic resonance imaging.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to make possible an accelerated data acquisition for magnetic resonance images by means of a PI method (PI: Parallel Imaging).

An inventive method is used for creating magnetic resonance images of a target object. The target or examination object can be a patient, an area of tissue or organ of a patient, a tissue sample or another object accessible to magnetic resonance imaging.

In an exemplary embodiment, in one method step of the inventive method, a reference dataset is recorded by means of a magnetic resonance system by carrying out a reference scan of the target object for each slice to be imaged of the target object by means of a GRE sequence (GRE: Gradient Echo) or by means of a RARE sequence (RARE: Rapid Acquisition with Refocused Echoes). The RARE sequence can for example be a TSE or a HASTE sequence (HASTE: Half Fourier-Acquired Single shot Turbo spin Echo). The reference scan can advantageously typically be carried out especially quickly by means of the GRE sequence, since only one radio-frequency pulse (RF pulse) is applied or used and thus an echo can be recorded, i.e. acquired, after an especially short time. The RARE sequence on the other hand can advantageously deliver especially good results for especially large variations of the $B_0$ magnetic field.

In an exemplary embodiment, the method includes recording a correction dataset using the magnetic resonance system by carrying out a phase correction scan of the target object for each slice of the target object to be imaged by means of a non-phase-encoding or non-phase-encoded EPI sequence. This can also be referred to as navigator data or as acquisition of navigator echoes.

In an exemplary embodiment, the method includes recording a measurement dataset of the target object using the magnetic resonance system by means of an SMS sequence. The SMS sequence thus serves as an imaging scan for acquisition or recording of magnetic resonance data or raw data of the target object, from which the magnetic resonance images of the imaged slices of the target object will be created or reconstructed.

In an exemplary embodiment, the method includes determining slice-specific GRAPPA kernels from the reference dataset. Thus at least one GRAPPA kernel is determined or computed for each imaged slice of the target object.

In an exemplary embodiment, the method includes creating or reconstructing the magnetic resonance images of the target object from the measurement dataset by a slice GRAPPA method using, for example, an appropriately configured data processor. Data of the measurement datasets belonging to different slices of the imaged slices can be separated or uncollapsed from one another in such cases by means of the slice-specific GRAPPA kernels. Nyquist-N/2 ghost artifacts, referred to below for short as N/2 ghost artifacts or ghost artifacts, are corrected in the measurement dataset or in the magnetic resonance images in such cases by means of the correction dataset or based on the correction dataset.

It is thus proposed in the present disclosure that a dedicated EPI-based phase correction scan be used for N/2 ghost correction and in addition the GRE or RARE-based reference scan for acquiring reference and correction data for a parallel imaging (PI) method. This enables a conventionally-provided, much longer EPI-based reference scan for the slice GRAPPA method to be dispensed with. This leads, through the inventive method, to the reference and correction data being able to be captured or acquired more quickly compared to the conventional EPI-based methods. Thus, by means of the present disclosure, a shortened overall examination time can advantageously be achieved. The present disclosure is based in this case on the knowledge that a GRE or RARE-based reference scan can be used for acquiring reference data for the slice GRAPPA calibration and then missing data can be obtained for the correction of the ghost artifacts by means of the phase correction or navigator scan proposed here.

In a conventional method for example a GRE-based reference scan of, for example, 3 seconds in length would be carried out for an in-plane GRAPPA calibration as well as a dummy EPI-Scan and an EPI reference scan for the slice GRAPPA calibration additionally of 10 seconds in length for example for 20 slices, so that thus at least 13 seconds will already be needed for the preliminary scan before an actual imaging scan. In particular for SMS accelerated diffusion-based sequences with an overall measurement time of for example only about one minute this leads to a significant loss of time, whereby the advantages of SMS-based imaging are at least partly negated. By contrast the preliminary scan provided as part of the present disclosure needs far less time, namely for example the same 3 seconds for GRE-based reference scan and for example 100 ms to 200 ms for the phase correction scan.

In the present case the phase correction scan can advantageously be carried out as a comparatively fast single-band scan. The measurement dataset on the other hand can be acquired for an especially precise and detailed imaging by means of a multiband imaging scan.

Methods known per se in the specialist field can be used for the separation of the data of the imaged slices by means of the slice-specific GRAPPA kernels and for the correction of the Nyquist-N/2 ghost artifacts.

The method steps of the inventive method can be carried out in the order described but also in other orders. It can be possible, for example, to record the measurement dataset before the reference dataset and/or the correction dataset. Two or more of the method steps can be performed simultaneously, in one or more aspects.

In an exemplary embodiment of the present disclosure, the reference scans are carried out consecutively for all slices and the phase correction scans are likewise carried out consecutively for all slices. In such cases all phase correction scans will be carried out after all of the reference scans have been carried out or before all of the reference scans are carried out. In other words all reference scans will be carried out bundled in each case first of all and thereafter all phase correction scans or vice versa. These variants of the method are advantageously especially easy to implement, since corresponding blocks or modules for an overall sequence are already available in conventional data collections or databases for sequence creation.

In an exemplary embodiment of the present disclosure, the reference scans and the phase correction scans are carried out in a nested order or in a restricted order with one another. In such cases the respective reference scan and the respective phase correction scan are carried out for each of the slices to be imaged before the respective reference and phase correction scans for the respective next slices to be imaged are carried out. For each individual slice of the slices in this case, first of all the reference scan and then the phase correction scan is carried out. Likewise conversely for each individual slice or the slices to be imaged, first of all the phase correction scan and then the reference scan is carried out. The reference and phase correction scans are thus carried out alternately for example, while the slices to be imaged are scanned in order. This nested, limited or offset order of carrying out the reference and phase correction scans is also referred to as interleaving. Since the respective reference scan and the respective phase correction scan are thus carried out immediately after one another for each slice, at least essentially the same steady states, i.e. states of equilibrium or equilibrium effects, are present for both preliminary scans for a specific slice and both preliminary scans for a specific slice will at least be carried out essentially in the same breathing or movement phase of the target object, i.e. with minimal spatial displacement of the target object between the two preliminary scans for a slice.

Through this an occurrence of movement artifacts might possibly be avoided or reduced.

In an exemplary embodiment of the present disclosure, when the preliminary scans are being recorded, i.e. the reference scan and the phase correction scan, only one excitation pulse is created for each one of the slices and after this the respective reference scan and the respective phase correction scan are carried out for the respective slice, without a second excitation pulse being created or applied between the reference scan and the phase correction scan for the respective slice. In other words an excitation pulse is thus created for a slice, then the reference scan or the phase correction scan are carried out for this slice and a residual magnetization of the slice is then used for the second preliminary scan of this slice, i.e. for the phase correction scan or for the reference scan. This enables the two preliminary scans to be carried out one after another without delay, so that the acquisition time needed and thus also the total time needed for the examination of the target object is further reduced, i.e. the data acquisition can be further speeded up. The exploitation of the magnetization created by a single excitation pulse for the respective reference and phase correction scan is relatively easy to realize here, since the phase correction scan can be carried out far more quickly for a slice than the reference scan. For example the phase correction scan for a slice can be carried out in approximately 5 ms, so that sufficient magnetization for this to carry out the reference scan is still present, i.e. is provided, in the respective slice after the one excitation pulse.

In the phase correction scan at least two echoes are acquired or recorded for one of the slices to be imaged in each case. In an especially advantageous embodiment of the present disclosure at least three echoes from each of the phase correction scans are used in each case for the correction dataset. In this case an average value from the first and the third echo is formed, in order to obtain a temporal consistency with the respective second echo. This can be applied appropriately transferred for further echoes if more than three echoes are acquired. In this way an especially precise phase or ghost artifact correction can advantageously be achieved, since a phase shift occurring during the phase correction scans between the echoes acquired in time after one another is taken into account. Especially preferably more than three echoes, for example 10 echoes, can likewise be acquired from each phase correction scan, i.e. for each of the slices to be imaged. A larger number of echoes acquired in the individual phase correction scans can contribute in such cases to a preliminary scan accuracy or reliability of the phase correction or of the correction of the ghost artifacts respectively. Especially preferably in such cases eddy current effects can be taken into account, whereby the accuracy of the correction can be further improved.

In exemplary embodiment of the present disclosure, flip angles, i.e. excitation angles of less than 90°, are used for the reference scans and the phase correction scans. In other words weaker or shorter excitation pulses are thus used for the preliminary scan than for the imaging scan for example, i.e. the SMS sequence for recording the measurement dataset. In this way saturation or pre-saturation effects before the beginning of the imaging scan can advantageously be avoided or reduced. Since the reference dataset and the correction dataset, although they are used for the creation or reconstruction of the magnetic resonance images, are not directly contained in data presented in the magnetic resonance images, the flip angles of less than 90°, i.e. the correspondingly weaker or shorter excitation pulses can be used without contrast of the created magnetic resonance images being negatively affected, i.e. diminished, by this.

In an exemplary embodiment of the present disclosure, the measurement dataset is recorded by means of a multiband SMS-EPI sequence, in particular for a diffusion-based imaging of the target object. A diffusion-based imaging of the target object can be or can include a diffusion-weighted imaging (DWI), a diffusion spectrum imaging (DSI) or a diffusion tensor imaging (DTI) for example. This embodiment of the present disclosure is based on the knowledge that this is a case in which the present disclosure can be applied to particular advantage and benefit. The reason for this lies in the fact that here a time saving achieved by the present disclosure compared to conventional methods or reference scans makes up an especially large percentage share of a period of time needed overall for the examination of the target object. For an SMS-accelerated diffusion sequence with a total measurement time of about one minute, up to 15% of the total measurement time can be saved by the present disclosure for example compared to a conventional method, in which an additional EPI-based dummy and reference scan is carried out for the slice GRAPPA method.

In an exemplary embodiment of the present disclosure, the reference dataset is recorded with a lower resolution than the measurement dataset. If for example 256 rows are recorded or sampled for the measurement dataset for a slice or for a segment of a slice, then for the same slice or the same segment, 8, 16 or 32 rows can be recorded or sampled for the reference dataset for example. This reduced resolution of the reference dataset advantageously makes possible an accelerated data acquisition and thereby a reduced overall measurement time for the examination of the target object.

In exemplary embodiment of the present disclosure, sensitivity variations between different receiver coils used in parallel for the recording of the measurement dataset are determined and taken into account for a creation of the magnetic resonance images. The receiver coils in such cases can be arranged on or at the target object, in order to make the parallel imaging possible. The sensitivity variations, also coil-specific characteristics or parameters of the individual receiver coils, can thus be evaluated and taken into account in order to achieve a preliminary scan accuracy during creation of the magnetic resonance images. Signals acquired or measured by means of the individual receiver coils or data streams assigned to the individual receiver coils are also referred to as coil channels in such cases.

The sensitivity variations, i.e. the coil data or coil characteristics of the individual receiver coils, can in particular be used to advantage in combination with reduced resolution of the reference dataset compared to the measurement dataset. After all data has been recorded or acquired, it is basically known how the individual slices must look, so that even with reduced resolution of the reference dataset, in particular taking into account the sensitivity variations, the slice GRAPPA calibration or the separation of the data or data parts of the measurement dataset belonging to the different slices can be carried out. Effectively a multiband acquisition can be simulated even when the reference scan has been carried out as a single band scan.

In an exemplary embodiment of the present disclosure, in addition to the slice GRAPPA method, an in-plane GRAPPA method, i.e. an in-plane acceleration, is used or applied. The reference dataset is then also used for calibrating the GRAPPA kernels for the in-plane GRAPPA method. In other words, the reference scan or the reference dataset can thus be used both for the slice or slice GRAPPA calibration and also for the in-plane GRAPPA calibration. Thus, in this way, the slice GRAPPA method and the in-plane GRAPPA method can advantageously be combined with one another and in this case only a single reference scan carried out for each of the slices to be imaged. The speed and efficiency of the inventive method can thus be further improved.

A further aspect of the present disclosure is a computer program or computer program product, which includes commands, program modules or control instructions that, when the computer program or computer program product is executed by a computer device of a magnetic resonance system, cause the computer device or the magnetic resonance system to carry out at least one form of embodiment of the inventive method for creating magnetic resonance images of a target object, in particular automatically. In such cases the computer device can be or can include a computer, a control device, a data processor or the like. In particular the computer device can have a processor device, i.e. a processor, a microchip or a microcontroller, for executing the computer program or computer program product. The inventive computer program or computer program product thus encodes or represents the instructions, processes or method steps of the inventive method. In particular the inventive computer program or computer program product is configured for loading into an, in particular electronic and/or electronically-readable, in particular computer-readable, data memory or data medium of a magnetic resonance system or of a data processor for carrying out the method steps.

A further aspect of the present disclosure is a data medium signal, which transmits at least one form of embodiment of the inventive computer program. The inventive data medium signal can thus be transmitted from an electronically-readable or computer-readable data medium to a magnetic resonance system or a data processor for carrying out the inventive method. This transmission can be undertaken via a wired or a wireless data connection for example.

A further aspect of the present disclosure is a computer-readable, i.e. in particular electronically-readable, data medium or data memory, on or in which at least one form of an embodiment of the inventive computer program or computer program product is stored. The inventive data medium can, in particular, be a data medium or data memory for a data processor and/or a controller of a magnetic resonance system or a data processor connected to a magnetic resonance system. Stored or encoded in or on the inventive data medium there can be program code and/or further control instructions for the data processor or the magnetic resonance system, in particular a part of the inventive computer program stored there.

A further aspect of the present disclosure is a magnetic resonance system with an acquisition or recording device (e.g. scanner) for recording of magnetic resonance data and with a data processor for processing the recorded magnetic resonance data. The data processor in this case includes an inventive computer-readable data medium and a processor device, i.e. a processor, a microchip or a microcontroller, connected to the data medium, which is configured for carrying out the inventive computer program or computer program product, i.e. program code stored on the computer-readable data medium, for carrying out at least one form of embodiment of the inventive method. The inventive magnetic resonance system is thus configured for recording a reference dataset by means of the recording device by carrying out a reference scan of the target object for each slice of the target object to be imaged by means of a GRE sequence or a RARE sequence. The inventive magnetic resonance system is further configured for recording a correction database, by means of the recording device by carrying out a phase correction scan of the target object for each slice of the target object to be imaged by means of a non-phase-encoding or non-phase-encoded EPI sequence. The inventive magnetic resonance system is further configured for recording, by means of the recording device, a measurement dataset of the target object by means of an SMS sequence. The inventive magnetic resonance system is further configured for processing, by means of the data processor, in particular automatically, the recorded magnetic resonance data, i.e. the reference dataset, the correction dataset and the measurement dataset and when doing so to determine from the reference dataset slice-specific GRAPPA kernels for the individual imaged slices and to create the magnetic resonance images of the target object from the measurement dataset by a slice GRAPPA method. The data processor is configured in this case to separate or to uncollapse from one another data of the measurement dataset belonging to different slices of the imaged slices by means of the slice-specific GRAPPA kernels and to correct Nyquist-N/2 ghost artifacts in the measurement dataset or in the magnetic resonance images by means of the correction dataset or based on the correction dataset.

The inventive magnetic resonance system can thus in particular be the magnetic resonance system described in conjunction with the inventive method and/or in conjunction with the other aspects of the present disclosure. Accordingly the inventive magnetic resonance system can have some or all of the characteristics and/or modules or components described in conjunction with the inventive method and/or the other aspects of the present disclosure.

The characteristics and development of the inventive method, of the inventive magnetic resonance system and of the other aspects of the present disclosure specified above and below as well as the corresponding advantages are able to be mutually transferred analogously in each case between the inventive method, the inventive magnetic resonance system and the other aspects of the present disclosure. Those developments of aspects of the present disclosure, which have embodiments that, to avoid unnecessary redundancy, are not explicitly described separately in the respective combination or for each aspect of the disclosure, thus also belong to the disclosure.

Known multislice EPI sequences, in which the individual slices are excited and sampled one after another, i.e. non-simultaneously, typically acquire a navigator echo before the actual image data is acquired for each slice. To this end FIG. 1 shows a schematic illustration of such a conventional non-simultaneous multislice data acquisition in magnetic resonance imaging. Four signals are plotted here in parallel to one another over time t. Plotted here as the first signal 1 is an RF or ADC (ADC: apparent diffusion coefficient) signal. Plotted as a second signal 2 is an associated readout gradient. Plotted as a third signal 3 is an associated phase-encoding gradient and plotted as a fourth signal 4 an associated slice gradient.

For the beginning of an overall sequence shown here an excitation pulse 5 is radiated in. In a subsequent time segment 6 a navigator sequence 7 consisting of three non-phase-encoded navigator echoes is executed or acquired. To do this three non-phase-encoded readout gradients E1, E2, E3 are created, wherein the readout gradients E1 and E3 have negative readout gradient polarities and the readout gradient E2 has a positive readout gradient polarity. Accordingly the navigator echoes corresponding to the readout gradients E1, E3 are also referred to as odd echoes and the navigator echo corresponding to the readout gradient E2 is referred to as an even echo.

In a time segment 8 following on from the time segment 6 an actual imaging sequence 9 is then carried out, in order to acquire magnetic resonance data, from which magnetic resonance images of the individual slices can then be created or reconstructed.

The navigator sequence 7 can typically be used during the reconstruction of the magnetic resonance images for two different corrections, namely for a slice-specific Nyquist-N/2 ghost artifact correction on the one hand and a $B_0$ field drift correction on the other hand. For the ghost artifact correction zero-order and first-order phase displacements between odd and even navigator echoes or readout gradients E1, E3, E2 in the readout direction are determined, by corresponding data from the image space being correlated with one another. This enables odd and even k-space lines to be re-aligned subsequently or retrospectively during the reconstruction of the magnetic resonance images. This enables displacements to be compensated for, which are caused for example by factors such as gradient delays or eddy currents. For $B_0$ field drift correction the DORK (Dynamic Off-Resonance in k-space) method known per se can be used. The temporal drift of the $B_0$ field is determined in this case by comparing a phase evolution of the navigator echoes or of the readout gradients E1, E3 or E2 with identical readout gradient polarities between image volumes acquired after one another. Appropriate computations are carried out in such cases as an average over a complete image volume.

In simultaneous multislice EPI (SMS-EPI) on the other hand a number of slices are excited simultaneously and corresponding magnetic resonance data is acquired simultaneously for this number of excited slices. This leads to a k-space dataset, which includes superimposed data from one or more slices, i.e. a number of slices collapsed on one another. A separation or uncollapsing of these slices or of the data belonging to the different slices is carried out during the reconstruction of the magnetic resonance images by means of a slice GRAPPA method. The slice GRAPPA method uncollapses the individual slices or the slice-specific data by means of respective slice-specific GRAPPA kernels. These kernels can be obtained from a separate non-collapsed preliminary scan before the acquisition of the collapsed, i.e. superimposed measurement or imaging data, i.e. magnetic resonance data.

For SMS acquisitions however the navigator echoes or corresponding navigator data acquired by means of the navigator sequence 7 are likewise collapsed, i.e. superimposed on one another. The DORK method carries out average computations over the image volume as a whole, which is why the collapsed navigator data can be used directly for this method, i.e. the $B_0$ field drift correction. The collapsed navigator data cannot be used however for slice-specific ghost artifact correction, since to date there has not been any known method for separating, i.e. uncollapsing, the phase-encoded navigator data.

If an in-plane acceleration, i.e. an in-plane GRAPPA method, is used in addition to the simultaneous multislice imaging (SMS), conventionally an in-plane GRAPPA reference scan is needed in addition to a slice GRAPPA reference scan. For low PAT factors in particular a completely sampled EPI scan is used for this. For higher in-plane PAT factors, i.e. GRAPPA factors>2, and for region of the body to be imaged that are susceptible to movement or typically exhibit movements, i.e. a stomach region for example, such an EPI scan as reference scan often leads to folding artifacts in the magnetic resonance images. This is attributable to the fact that the EPI scan must be acquired for higher acceleration factors by means of interleaving. Samplings of different segments of a slice are distanced from each other in time by this at least by a respective repetition time TR. This in its turn leads to the corresponding segments often being acquired during different movement states or breathing states or phases.

As an alternative that is comparatively robust in relation to movement a GRE-based reference scan can be used for an in-plane GRAPPA calibration. To this end a conventional GRE sequence can be carried out in turn for each slice. Corresponding reference data for a complete slice in such cases can typically be read out, i.e. acquired in around 100 ms.

Figure 2:
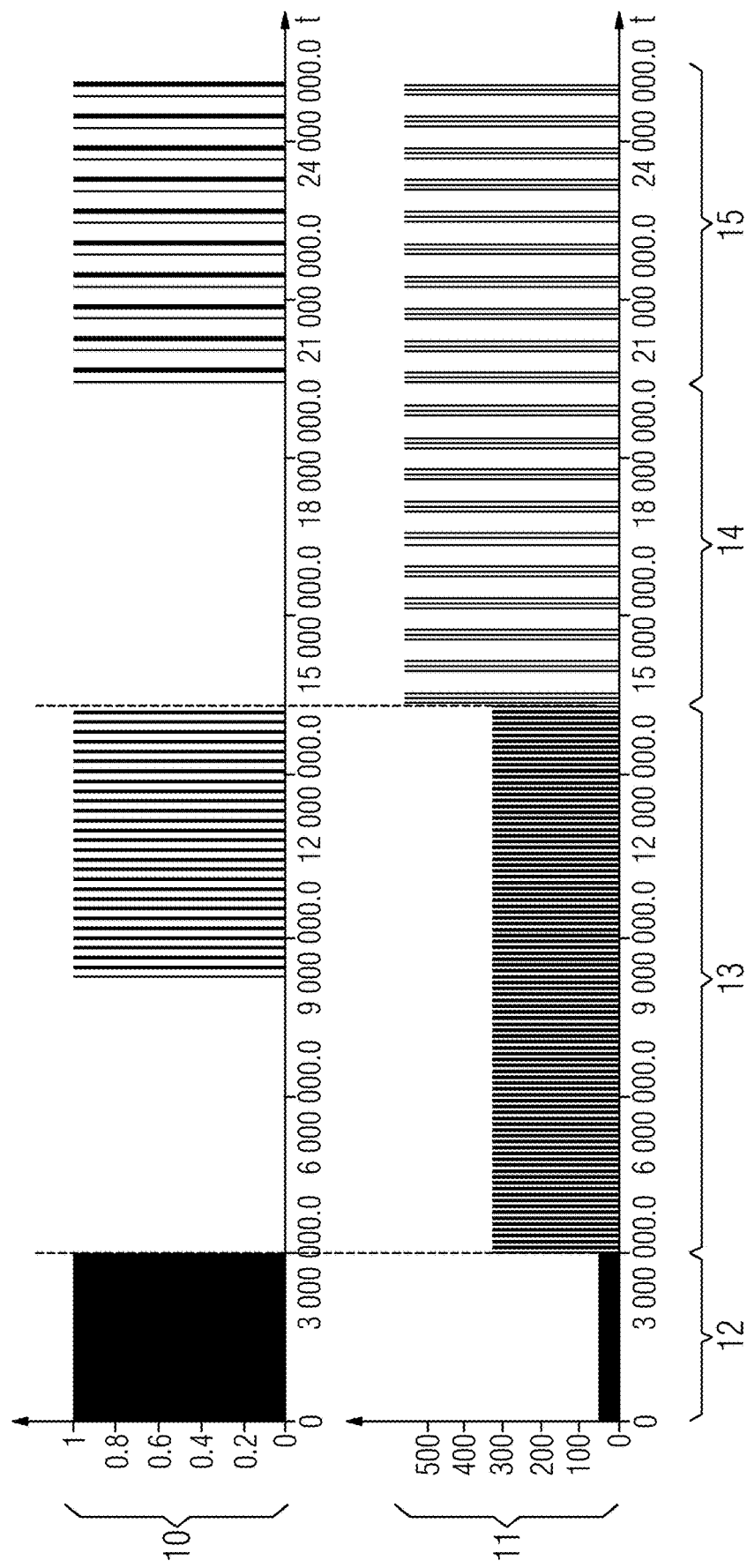
FIG. 2 is a schematic illustration of a sequence diagram for a conventional SMS-EPI sequence.

FIG. 2 shows a schematic illustration of an initial part of a sequence diagram for a conventional SMS-EPI data acquisition for 20 slices. Plotted along one time axis t are an ADC signal 10 and below it, in parallel to it, an RF signal 11. In a first time segment 12 a single band GRE-reference scan for in-plane GRAPPA is carried out, which in the present example requires around 3 seconds for the 20 slices. Thereafter, in a time segment 13, initially a single-band dummy EPI scan for slice GRAPPA and a single-band EPI-reference scan for slice GRAPPA are carried out. The length of the time segment 13 required for this amounts for the 20 slices in the present example to around 10 seconds. In a time segment 14 following on from this, a multiband dummy EPI-scan is initially carried out, in order to establish an equivalent steady state in all slices, in order to obtain the same contrast values in the ultimately created magnetic resonance images for all slices. In a time segment 15 following on from this the actual multiband imaging EPI scan for acquiring the magnetic resonance data, which will ultimately be shown in the resonance images, is carried out. It can be seen clearly here that the preparatory dummy EPI scan and the EPI reference scan for the slice GRAPPA method in time segment 13 requires far more time than the GRE-based reference scan in time segment 12.

The GRE-based reference scan in time segment 12 is previously not used as a reference for the slice GRAPPA method however, since then data needed for the correction of the ghost artifacts would be missing. Therefore the GRE-based reference scan in time segment 12 for an in-plane GRAPPA-calibration, the dummy EPI scan for a preparation of an equivalent steady state, and the EPI reference scan in time segment 13 for a slice GRAPPA calibration are carried out after one another. For example for SMS-accelerated diffusion-based sequences with an overall measurement time of around one minute, this can lead to significant lost time, which can negate at least partly the timing advantages of a simultaneous multislice acquisition (SMS) faster per se compared to other methods.

In an exemplary embodiment, the GRE-based reference scan is used for slice GRAPPA-calibration, by which advantageously an acquisition of the reference or correction data needed and thus the respective overall sequence can be significantly accelerated. In an exemplary embodiment, in addition to the GRE-based reference scan, a dedicated phase correction scan for acquisition of correction data for the correction of ghost artifacts is carried out.

Figure 3:
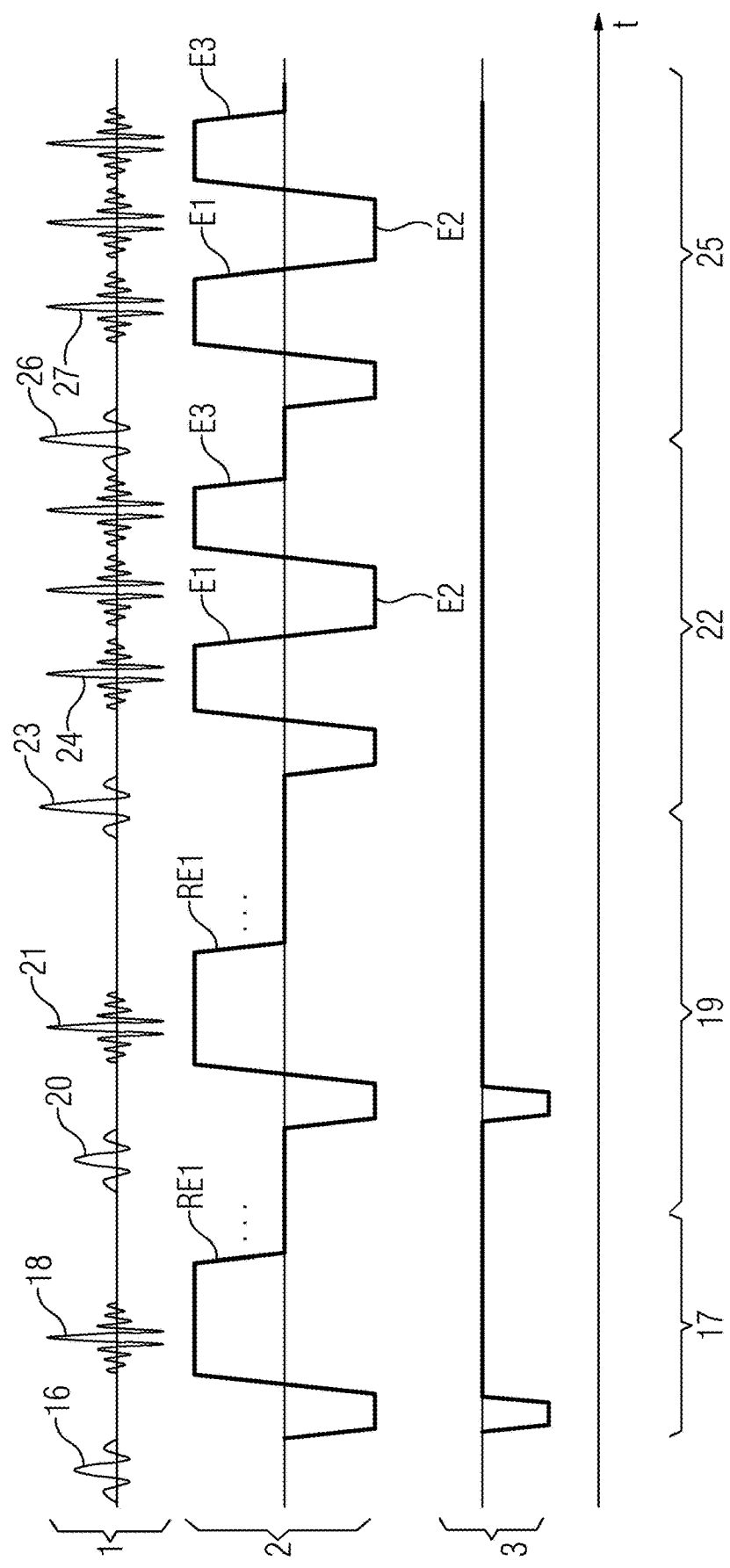
FIG. 3 is a schematic section of an illustration of a sequence diagram of a preliminary scan sequence for an SMS magnetic resonance imaging according to an exemplary embodiment of the present disclosure.

FIG. 3 shows a schematic and sectional illustration of a sequence diagram, according to an exemplary embodiment, of a corresponding preliminary scan sequence for SMS imaging or data acquisition, respectively. Here too an RF or ADC signal as first signal 1, associated readout gradients as second signal 2 and an associated phase encoding signal or phase-encoding gradient as third signal 3 are plotted underneath one another on a time axis t.

In this figure the sequence begins with a first excitation pulse 16, which brings about an excitation angle or flip angle α in a first slice. In a time segment 17 a first reference scan echo 18 is initially acquired and corresponding reference data is entered into a reference matrix for the first slice. Shown by way of example here is a corresponding first readout gradient RE1 for the first reference scan echo 18. A reference matrix, i.e. the reference data for a slice, can typically include 20 to 64 reference scan echoes 18 for example, of which only one is shown here for the sake of clarity. After the GRE reference scan for the first slice is concluded, in a second time segment 19, a second excitation pulse 20 for exciting a second slice, i.e. for creating an excitation or flip angle, in particular the flip angle α, in the second slice, is output. Subsequently a second reference scan echo 21 is acquired and corresponding reference data is entered into the reference matrix for the second slice. Here too only the first reference scan echo 21 and an associated first readout gradient RE1 for the second slice are shown by way of example. In the overall sequence shown here as an example the GRE reference scans are thus listed one after another for all slices to be imaged. This is only shown here for two slices for the sake of clarity, but can likewise be continued for a greater number of slices.

After the GRE reference scans for all slices are concluded, in a subsequent time segment 22, a ghost correction or phase correction scan for the first slice is carried out. To do this, a third excitation pulse 23 is first created to set an excitation or flip angle β in the first slice. Then a first phase correction echo train 24 is created and the appropriate navigator echoes for the first slice, corresponding to the readout gradients E1, E2, E3, are acquired. In a corresponding way, in a time segment 25, a fourth excitation pulse 26 and a second phase correction echo train 27 are then created, in order to acquire the appropriate navigator echoes for the second slice corresponding to the readout gradients E1, E2, E3. Thus a 3-echo EPI phase correction scan that is comparatively quick to carry out is carried out for all slices one after the other. By means of the excitation pulses 23, 26 used for this the excitation or flip angle β is set in the individual slices in each case.

Both the flip angle α used for the GRE reference scans and also the flip angle β used for the phase correction scans can in particular be less than 90° in such cases, in order to avoid saturation or pre-saturation effects before an imaging sequence following on from the time segment 25, i.e. in order to maintain a longitudinal magnetization in the slices as far as possible.

The single-band navigator sequences for acquiring the phase correction data in the time segments 22, 25 can be carried out in this case for each individual slice in for example 5 ms, so that an EPI scan carried out in addition in time segment 13 for acquiring the corresponding correction dataset, in particular by comparison with the sequence diagram shown in FIG. 2 is very small.

By contrast with what is shown in the sequence diagram in FIG. 3, the phase correction scans can likewise be carried out prior to the GRE-reference scans for all slices.

Figure 4:
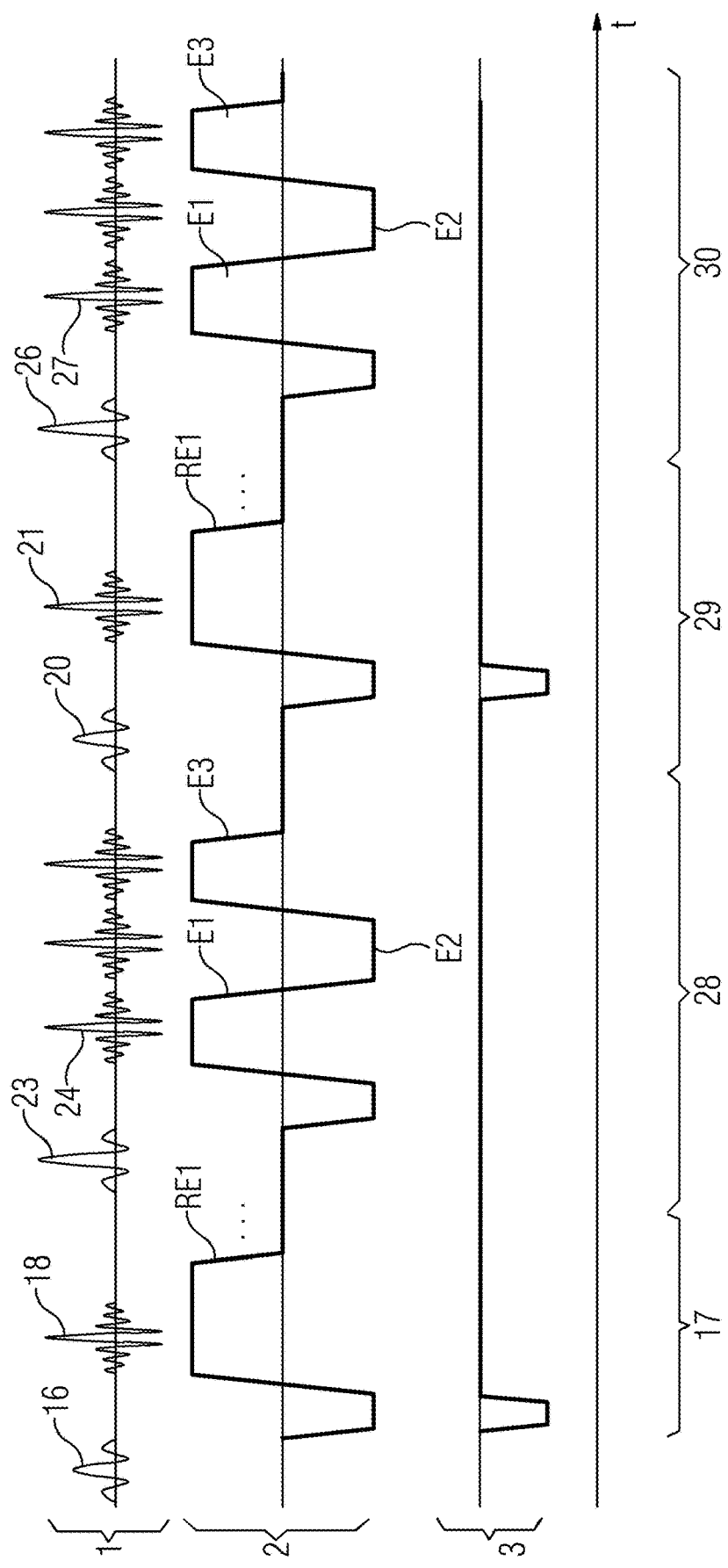
FIG. 4 is a schematic section of an illustration of a sequence diagram of a preliminary scan sequence for an SMS magnetic resonance imaging according to an exemplary embodiment of the present disclosure.

FIG. 4 shows a schematic illustration of a section of a sequence diagram of a preliminary scan sequence for an SMS magnetic resonance imaging according to an exemplary embodiment. The individual components in this figure essentially correspond to the components already described in conjunction with FIG. 3, so that only the differences will be explained here. For the sequence indicated in FIG. 4 an interleaving method is used for the GRE reference scans and the phase correction scans.

Here, the GRE reference scan for the first slice is carried out first of all in time segment 17. Following on from this, in a time segment 28, the phase correction scan for the first slice is carried out first of all. In this sense the time segment 28 thus corresponds functionally to the time segment 25 from FIG. 3. Subsequently, in a time segment 29, the GRE reference scan for the second slice and following on from this, in a time segment 30, the phase correction scan for this second slice is carried out. In this sense the time segment 29 thus corresponds functionally to the time segment 19 from FIG. 3 and the time segment 30 corresponds to the time segment 25 from FIG. 3. Here too the times of the GRE reference scans and the phase correction scans can be swapped, so that thus for example first of all the phase correction scan for the first slice, then the GRE reference scan for the first slice—or vice versa—and then the corresponding scans for the second slice can be carried out.

In the sequence shown in FIG. 4, the excitation pulses provided in each case between a GRE reference scan and a phase correction scan for a slice, i.e. the third excitation pulse 23 and the fourth excitation pulse 26 here, can be left out, depending on the design or suitability of a magnetic resonance system used in each case. Then only one excitation pulse can be provided in each case for a slice, after which both the GRE reference scan and also the phase correction scan will be carried out for this slice without a further excitation pulse.

Figure 5:
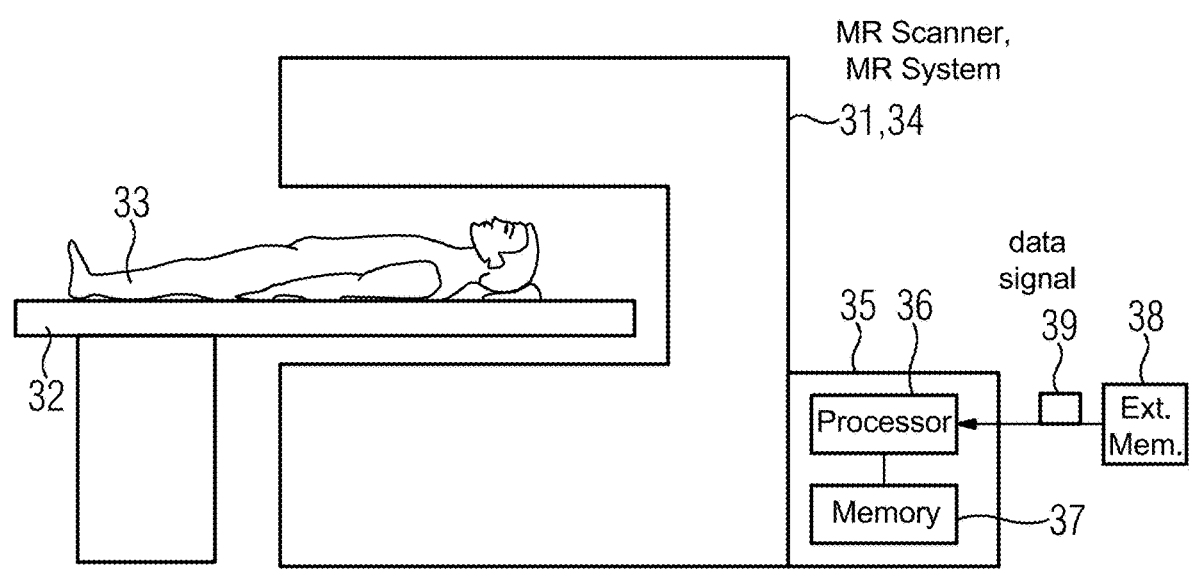
FIG. 5 is a schematic diagram of a magnetic resonance system according to an exemplary embodiment of the present disclosure.

FIG. 5 shows a schematic diagram of a magnetic resonance (MR) system 31 according to an exemplary embodiment. The MR system 31 includes a patient table 32, on which a patient 33 can be arranged. In an exemplary embodiment, the magnetic resonance system 31 includes a MR scanner 34 configured to acquire or record magnetic resonance data. In an exemplary embodiment, the scanner 34 can, for example, include corresponding magnetic coils, a power amplifier, a pulse shaper, a signal processor and/or further electrical or electronic components as would be understood by one of ordinary skill in the art.

In an exemplary embodiment, the MR system 31 includes data processor 35, which includes a processor 36 and a data medium (e.g. memory) 37 connected to the processor 36. The data processor 35 can be a component of the magnetic resonance system 31, in particular integrated into it. The data processor 35 can also be a separate device however, which can be arranged separately from the magnetic resonance system 31 or from the scanner 34 for example, on premise in a local computer center, for example. In an exemplary embodiment, the data processor 35 is a computer center arranged remotely, a cloud server, or the like. In an exemplary embodiment, the magnetic resonance system 31 and the data processor 35 can then be connected to one another using corresponding data lines or data connections.

In an exemplary embodiment, the data processor 35 includes processor circuitry that is configured to perform one or more operations and/or functions of the data processor 35, including controlling the MR system 34 to record a reference dataset, a correction dataset, and a measurement dataset, and/or controlling to operation of the MR system 34 (including controlling one or more components (e.g. scanner 31) of the MR system 34).

In an exemplary embodiment, stored on the data medium (e.g. memory) 37 is a computer program or computer program product, i.e. program code configured to be executed by the processor 36, which encodes or represents method steps of a method for creating magnetic resonance images by the magnetic resonance system 31, i.e. includes corresponding control and/or processing commands. Through execution of the computer program stored on the data medium 37 by the processor 36, the magnetic resonance system 31 is thus caused to record a reference dataset, a correction dataset and a measurement dataset, according to one or more exemplary embodiments as described with reference to FIG. 3 and FIG. 4. The reference dataset is recorded in this case by carrying out a reference scan of the patient 33 for each slice to be imaged by means of a GRE sequence or a RARE sequence. The correction dataset is recorded by carrying out a phase correction scan of the patient 33 for each slice to be imaged by means of a non-phase-encoding EPI sequence. The measurement dataset is recorded by means of an SMS sequence, in particular an SMS-EPI sequence. Slice-specific GRAPPA kernels for the individual slices are then determined from the reference dataset by means of the data processor 35. Magnetic resonance images of the patient 33 are further created from the measurement dataset by a slice GRAPPA method by means of the data processor 35. In such cases data of the measurement dataset belonging to different slices of the imaged slices are separated from one another by means of the slice-specific GRAPPA kernels and Nyquist-N/2 ghost artifacts are corrected in the measurement dataset by means of the correction dataset.

In addition or as an alternative to the storage of the computer program on the data medium 37, the corresponding computer program can also be stored on an external data memory 38 for example and then transferred or transmitted as a data medium signal 39 to the data processor 35.

Overall the examples described show how an accelerated data acquisition for an SMS magnetic resonance imaging can be realized by acquisition of phase correction data by means of a phase correction EPI scan and acquisition of reference data for a slice GRAPPA calibration.

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for creating magnetic resonance (MR) images of a target object, the method comprising:
performing, using a MR system, a respective reference scan of the target object, for each slice of the target object to be imaged, to record a reference dataset, the performance of each of the respective reference scans including separately performing a Gradient Echo (GRE) sequence or a Rapid Acquisition with Refocused Echoes (RARE) sequence for each of the respective slices of the target object to be imaged;
performing, using the MR system, a respective phase correction scan of the target object, for each slice of the target object to be imaged, to record a correction dataset, the performance of each of the phase correction scans including performing a non-phase-encoding Echo-Planar Imaging (EPI) sequence for each of the slices of the target object to be imaged;

performing, using the MR system, a Simultaneous Multislice (SMS) sequence to record a measurement dataset of the target object;

determining slice-specific Generalized Autocalibrating Partial Parallel Acquisition (GRAPPA) kernels based on the reference dataset; and creating, by a processor of the MR system, the MR images of the target object based on the measurement dataset using a slice GRAPPA method, wherein creating the MR images includes:

separating data of the measurement dataset belonging to different slices of the slices imaged from one another based on the slice-specific GRAPPA kernels; and correcting Nyquist-N/2 ghost artifacts in the measurement dataset based on the correction dataset.

2. The method as claimed in claim 1, wherein the reference scans for all slices are carried out one after the other and the phase correction scans for all slices are carried out one after the other, all of the phase correction scans being carried out after all of the reference scans have been carried out.

3. The method as claimed in claim 1, wherein the reference scans for all slices are carried out one after the other and the phase correction scans for all slices are carried out one after the other, all of the phase correction scans being carried out before all the reference scans are carried out.

4. The method as claimed in claim 1, wherein:
the reference scans and the phase correction scans are carried out in a nested order; and
for each of the slices to be imaged, the respective reference scan and the respective phase correction scan are carried out before the respective reference scans and phase correction scans for a next slice of the slices to be imaged.

5. The method as claimed in claim 4, wherein only one excitation pulse is created for each one of the slices, and after the excitation pulse, the respective reference scan and the respective phase correction scan are carried out for the respective slice, without a second excitation pulse being created for the respective slice between the respective reference scan and the respective phase correction scan for the respective slice.

6. The method as claimed in claim 1, wherein each of the phase correction scans comprises at least three echoes to record the correction dataset, an average value being formed from a first of the at least three echoes and a third echo of the at least three echoes to obtain a temporal consistency with a respective second echo of the at least three echoes.

7. The method as claimed in claim 1, wherein flip angles of less than 90° are used for the reference scans and the phase correction scans.

8. The method as claimed in claim 1, wherein the measurement dataset is recorded using a multiband simultaneous multislice Echo-Planar Imaging (SMS-EPI) sequence to provide a diffusion-based imaging of the target object.

9. The method as claimed in claim 1, wherein the reference dataset is recorded with a lower resolution than the measurement dataset.

10. The method as claimed in claim 1, further comprising determining sensitivity variations between different receiver coils, of the MR system, used in parallel for the recording of the measurement dataset, wherein the MR images of the target object are created using the determined sensitivity variations.

11. The method as claimed in claim 1, wherein creating the MR images additionally uses an in-plane GRAPPA method, the method further comprising calibrating the GRAPPA kernels for the in-plane GRAPPA method based on the reference dataset.

12. A non-transitory computer-readable storage medium with an executable computer program stored thereon, that when executed, instructs a processor to perform the method of claim 1.

13. A magnetic resonance (MR) system, comprising:
a MR scanner configured to record MR data for a target object; and
a data processor configured to process the recorded MR data, the data processor including a memory that stores a computer program, and a processor communicatively coupled to the memory and configured to execute the computer program to:
control the MR scanner to perform a reference scan of the target object to record a reference dataset, the performance of the reference scan including separately performing a Gradient Echo (GRE) sequence or a Rapid Acquisition with Refocused Echoes (RARE) sequence for each respective slice of the target object to be imaged;
control the MR scanner to perform a phase correction scan of the target object to record a correction dataset, the performance of the phase correction scan including performing a non-phase-encoding Echo-Planar Imaging (EPI) sequence for each slice of the target object to be imaged;
perform a Simultaneous Multislice (SMS) sequence to record a measurement dataset of the target object;
determine slice-specific Generalized Autocalibrating Partial Parallel Acquisition (GRAPPA) kernels based on the reference dataset; and
create MR images of the target object based on the measurement dataset using a slice GRAPPA method, wherein creating the MR images includes:
separating data of the measurement dataset belonging to different slices of the slices imaged from one another based on the slice-specific GRAPPA kernels; and
correcting Nyquist-N/2 ghost artifacts in the measurement dataset based on the correction dataset.

14. The method as claimed in claim 1, wherein for each of the respective slices: only a single excitation pulse is created, and the respective reference scan and the respective phase correction scan are carried out after the single excitation pulse.

* * * * *